(12) United States Patent
Arena

(10) Patent No.: US 9,793,360 B2
(45) Date of Patent: Oct. 17, 2017

(54) METHODS OF FABRICATING SEMICONDUCTOR STRUCTURES OR DEVICES USING LAYERS OF SEMICONDUCTOR MATERIAL HAVING SELECTED OR CONTROLLED LATTICE PARAMETERS

(71) Applicant: Soitec, Crolles (FR)

(72) Inventor: Chantal Arena, Mesa, AZ (US)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 14/314,804

(22) Filed: Jun. 25, 2014

(65) Prior Publication Data

US 2014/0306320 A1  Oct. 16, 2014

Related U.S. Application Data

(62) Division of application No. 13/060,398, filed as application No. PCT/US2009/051505 on Jul. 23, 2009, now Pat. No. 8,765,508.

(Continued)

(51) Int. Cl.
*H01L 29/20* (2006.01)
*H01L 21/18* (2006.01)
(Continued)

(52) U.S. Cl.
CPC ........ *H01L 29/2003* (2013.01); *H01L 21/187* (2013.01); *H01L 21/76254* (2013.01); *H01L 33/0079* (2013.01)

(58) Field of Classification Search
CPC ............... H01L 21/187; H01L 29/2003; H01L 33/0079; H01L 21/76254
(Continued)

(56) References Cited

U.S. PATENT DOCUMENTS 5,635,093 A  6/1997 Arena et al.
5,972,790 A  10/1999 Arena et al.
(Continued)

FOREIGN PATENT DOCUMENTS

JP  2007220899 A  8/2007
JP  2008120627 A  5/2008
(Continued)

OTHER PUBLICATIONS

Kolseke et al., "Improved Brightness of 380nm LED", Applued Physics Letters, vol. 81, Issue 11, Sep. 9, 2002; pp. 1940-1942.*
(Continued)

*Primary Examiner* — Bo Fan
(74) *Attorney, Agent, or Firm* — TraskBritt

(57) ABSTRACT

Methods of fabricating semiconductor devices or structures include bonding a layer of semiconductor material to another material at a temperature, and subsequently changing the temperature of the layer of semiconductor material. The another material may be selected to exhibit a coefficient of thermal expansion such that, as the temperature of the layer of semiconductor material is changed, a controlled and/or selected lattice parameter is imparted to or retained in the layer of semiconductor material. In some embodiments, the layer of semiconductor material may comprise a III-V type semiconductor material, such as, for example, indium gallium nitride. Novel intermediate structures are formed during such methods. Engineered substrates include a layer of semiconductor material having an average lattice parameter at room temperature proximate an average lattice parameter of the layer of semiconductor material previously attained at an elevated temperature.

14 Claims, 3 Drawing Sheets

Related U.S. Application Data

(60) Provisional application No. 61/092,373, filed on Aug. 27, 2008.

(51) Int. Cl.
*H01L 21/762* (2006.01)
*H01L 33/00* (2010.01)

(58) Field of Classification Search
USPC ............ 257/615, 192, 79, 14; 438/458, 478
See application file for complete search history.

(56) References Cited

U.S. PATENT DOCUMENTS

| | | | |
|---|---|---|---|
| 6,090,705 | A | 7/2000 | Arena et al. |
| 6,121,140 | A | 9/2000 | Arena et al. |
| 6,303,468 | B1 | 10/2001 | Aspar et al. |
| 6,316,333 | B1 | 11/2001 | Bruel et al. |
| 6,335,258 | B1 | 1/2002 | Aspar et al. |
| 6,362,077 | B1 | 3/2002 | Aspar et al. |
| 6,372,609 | B1 | 4/2002 | Aga et al. |
| 6,440,494 | B1 | 8/2002 | Arena-Foster |
| 6,465,327 | B1 | 10/2002 | Aspar et al. |
| 6,558,998 | B2 | 5/2003 | Belleville et al. |
| 6,559,075 | B1 | 5/2003 | Kelly et al. |
| 6,740,604 | B2 | 5/2004 | Kelly et al. |
| 6,756,286 | B1 | 6/2004 | Moriceau et al. |
| 6,808,967 | B1 | 10/2004 | Aspar et al. |
| 6,809,009 | B2 | 10/2004 | Aspar et al. |
| 6,809,044 | B1 | 10/2004 | Aspar et al. |
| 6,946,365 | B2 | 9/2005 | Aspar et al. |
| 7,060,590 | B2 | 6/2006 | Bressot et al. |
| 7,067,396 | B2 | 6/2006 | Aspar et al. |
| RE39,484 | E | 2/2007 | Bruel |
| 7,176,108 | B2 | 2/2007 | Cayrefourcq et al. |
| 7,180,066 | B2 | 2/2007 | Qiu |
| 7,208,392 | B1 | 4/2007 | Jaussaud et al. |
| 7,229,899 | B2 | 6/2007 | Moriceau et al. |
| 7,271,416 | B2 | 9/2007 | Saxler |
| 7,300,853 | B2 | 11/2007 | Joly et al. |
| 7,332,030 | B2 | 2/2008 | Bruel |
| 7,341,925 | B2 | 3/2008 | Kelly et al. |
| 2002/0148720 | A1 | 10/2002 | Arena-Foster et al. |
| 2002/0182775 | A1 | 12/2002 | Belford |
| 2004/0097022 | A1 | 5/2004 | Werkhoven et al. |
| 2004/0161904 | A1 | 8/2004 | Berne et al. |
| 2004/0166649 | A1 | 8/2004 | Bressot et al. |
| 2004/0171232 | A1 | 9/2004 | Cayrefourcq et al. |
| 2004/0259333 | A1 | 12/2004 | Tomasini et al. |
| 2005/0026432 | A1 | 2/2005 | Atwater et al. |
| 2005/0051795 | A1 | 3/2005 | Arena et al. |
| 2005/0214965 | A1 | 9/2005 | Park et al. |
| 2005/0253152 | A1* | 11/2005 | Klimov .................. B82Y 20/00 257/79 |
| 2005/0279994 | A1 | 12/2005 | Ueda et al. |
| 2006/0234504 | A1 | 10/2006 | Bauer et al. |
| 2007/0072324 | A1 | 3/2007 | Krames et al. |
| 2007/0264801 | A1 | 11/2007 | Cody et al. |
| 2007/0278509 | A1* | 12/2007 | Kusunoki ........... H01L 33/0079 257/98 |
| 2007/0278622 | A1 | 12/2007 | Lester et al. |
| 2008/0026149 | A1 | 1/2008 | Tomasini et al. |
| 2011/0156212 | A1 | 6/2011 | Arena |

FOREIGN PATENT DOCUMENTS

| | | |
|---|---|---|
| JP | 2008124206 A | 5/2008 |
| WO | 9307550 A1 | 4/1993 |
| WO | 9533866 A1 | 12/1995 |
| WO | 9642105 A1 | 12/1996 |
| WO | 9919532 A1 | 4/1999 |
| WO | 9936951 A1 | 7/1999 |
| WO | 0003429 A1 | 1/2000 |
| WO | 0024059 A1 | 4/2000 |
| WO | 0118853 A1 | 3/2001 |
| WO | 0177407 A1 | 10/2001 |
| WO | 03096385 A2 | 11/2003 |
| WO | 03096385 A3 | 11/2003 |
| WO | 2004066380 A1 | 8/2004 |
| WO | 2004081986 A2 | 9/2004 |
| WO | 2004081987 A2 | 9/2004 |
| WO | 2004081986 A3 | 11/2004 |
| WO | 2004081987 A3 | 1/2006 |
| WO | 2006083821 A1 | 8/2006 |
| WO | 2007140375 A2 | 12/2007 |
| WO | 2007143743 A2 | 12/2007 |
| WO | 2007140375 A3 | 1/2008 |
| WO | 2008010771 A1 | 1/2008 |
| WO | 2007143743 A3 | 3/2008 |

OTHER PUBLICATIONS

Lee et al., Inductively Coupled Cl2/Ar/O2 Plasma Etching of GaN, InGaN, and AlGaN, Journal of the Korean Physical Society, vol. 37, No. 6, Dec. 2000, pp. 842-845.

Mileham et al., Wet Chemical Etching of AlN, Appl. Phys. Lett., vol. 67, No. 8, Aug. 21, 1995, pp. 1119-1121.

International Search Report for International Application No. PCT/US2009/051505, mailed Oct. 23, 2009, 3 pages.

International Written Opinion for International Application No. PCT/US2009/051505, mailed Oct. 23, 2009, 6 pages.

International Preliminary Report on Patentability for International Application No. PCT/US2009/051505 dated Mar. 1, 2011, 7 pages.

European Office Action for EP Application No. 09790754.7 dated Aug. 29, 2011, 6 pages.

Ohta et al., Room-Temperature Epitaxial Growth of GaN on Conductive Substrates, Applied Physics Letters, vol. 83, No. 15, Oct. 13, 2003, pp. 3060-3062.

Robertson et al., Epitaxial of Diamond Films on si(111) at Room Temperature by Mass-Selected Low-Energy C+ Beams, Science, vol. 243, Feb. 24, 1989, pp. 1047-1050.

Japanese Office Action for Japanese Application No. 2011-525040 dated Apr. 2, 2013, 4 pages.

Chinese First Office Action for Chinese Application No. 200980128003, dated Mar. 4, 2013, 13 pages.

Chinese Second Office Action for Chinese Application No. 200980128003, dated Sep. 27, 2013, 13 pages.

Japanese Search Report for Japanese Application No. 2011-525040, dated Feb. 28, 2013, 12 pages.

Korean Written Opinion for Korean Application No. 20127009724, dated Oct. 19, 2012, 11 pages.

Korean Written Opinion for Korean Application No. 20117004223, dated Apr. 16, 2012, 6 pages.

Korean Written Opinion for Korean Application No. 20117004223, dated Oct. 25, 2012, 4 pages.

* cited by examiner

METHODS OF FABRICATING SEMICONDUCTOR STRUCTURES OR DEVICES USING LAYERS OF SEMICONDUCTOR MATERIAL HAVING SELECTED OR CONTROLLED LATTICE PARAMETERS

PRIORITY CLAIM

This application is a divisional of U.S. patent application Ser. No. 13/060,398, filed Feb. 2, 2011, now U.S. Pat. No. 8,765,508, issued Jul. 1, 2014 which is a national phase entry under 35 U.S.C §371 of International Patent Application PCT/US2009/051505, filed Jul. 23, 2009, published in English as International Patent Publication WO 2010/024987 A1 on Mar. 4, 2010, which claims the benefit of the filing date of U.S. Provisional Patent Application Ser. No. 61/092,373 filed Aug. 27, 2008, for "Methods of Fabricating Semiconductor Structures or Devices Using Layers of Semiconductor Material Having Selected or Controlled Lattice Parameters," the disclosure of each of which is hereby incorporated herein by this reference.

TECHNICAL FIELD

The present invention generally relates to the fabrication of semiconductor structures or devices using engineered substrates, to intermediate structures formed during the fabrication of semiconductor structures or devices, and to engineered substrates for use in the fabrication of semiconductor structures or devices.

BACKGROUND

Substrates that include one or more layers of semiconductor material are used to form a wide variety of semiconductor structures and devices including, for example, integrated circuit (IC) devices (e.g., logic processors and memory devices), radiation-emitting devices (e.g., light-emitting diodes (LEDs), resonant cavity light-emitting diodes (RCLEDs), and vertical cavity surface-emitting lasers (VCSELs)), and radiation sensing devices (e.g., optical sensors). Such semiconductor devices are conventionally formed in a layer-by-layer manner (i.e., lithographically) on and/or in a surface of a semiconductor substrate.

Historically, a majority of such semiconductor substrates that have been used in the semiconductor device manufacturing industry have comprised thin discs or "wafers" of silicon material. Such wafers of silicon material are fabricated by first forming a large generally cylindrical silicon single crystal ingot and subsequently slicing the single crystal ingot perpendicularly to its longitudinal axis to form a plurality of silicon wafers. Such silicon wafers may have diameters as large as about thirty centimeters (30 cm) or more (about twelve inches (30.48 cm) or more). Although silicon wafers generally have thicknesses of several hundred microns (e.g., about 700 microns) or more, only a very thin layer (e.g., less than about three hundred nanometers (300 nm)) of the semiconductor material on a major surface of the silicon wafer is actually used to form active devices on the silicon wafer.

It has been discovered that the speed and power efficiency of semiconductor devices can be improved by electrically insulating the portion of the semiconductor material on a semiconductor substrate that is actually used to form the semiconductor devices from the remaining bulk semiconductor material of the substrate. As a result, so-called "engineered substrates" have been developed that include a relatively thin layer of semiconductor material (e.g., a layer having a thickness of less than about three hundred nanometers (300 nm)) disposed on a layer of dielectric material (e.g., silicon dioxide ($SiO_2$), silicon nitride ($Si_3N_4$), or aluminum oxide ($Al_2O_3$)). Optionally, the layer of dielectric material may be relatively thin (e.g., too thin to enable handling by conventional semiconductor device manufacturing equipment), and the semiconductor material and the layer of dielectric material may be disposed on a relatively larger host or base substrate to facilitate handling of the overall engineered substrate by manufacturing equipment. As a result, the base substrate is often referred to in the art as a "handle" or "handling" substrate. The base substrate may also comprise a semiconductor material.

A wide variety of engineered substrates are known in the art and may include semiconductor materials such as, for example, silicon (Si), germanium (Ge), III-V type semiconductor materials, and II-VI type semiconductor materials.

For example, an engineered substrate may include an epitaxial layer of III-V type semiconductor material formed on a surface of a base substrate such as, for example, aluminum oxide ($Al_2O_3$) (which may be referred to as "sapphire"). Using such an engineered substrate, additional layers of material may be formed and processed (e.g., patterned) over the epitaxial layer of III-V type semiconductor material to form one or more devices on the engineered substrate.

When a layer of semiconductor material is formed (e.g., epitaxially grown) over another layer of material (e.g., an underlying layer of dielectric material or an underlying layer of a different semiconductor material) at elevated temperatures, lattice strain may be induced in the crystal lattice of the layer of semiconductor material when the resulting structure is cooled to room temperature due to any difference in the coefficients of thermal expansion (CTE) exhibited by the respective adjacent materials. If the underlying material exhibits a coefficient of thermal expansion that is higher than the coefficient of thermal expansion exhibited by the semiconductor material, the semiconductor material may be disposed in a state of compressive strain upon cooling the resulting structure. In contrast, if the underlying material exhibits a coefficient of thermal expansion that is less than the coefficient of thermal expansion exhibited by the semiconductor material, the semiconductor material may be disposed in a state of tensile strain upon cooling the resulting structure. There are various semiconductor devices and processes in which such lattice strain imposes limitations on the devices that can be fabricated.

For example, indium gallium nitride ($In_xGa_{1-x}N$) devices may be formed on an engineered substrate by growing one or more epitaxial device layers each comprising indium gallium nitride ($In_xGa_{1-x}N$) (which together form a "device structure stack") on a seed layer of a III-nitride material (e.g., gallium nitride, indium gallium nitride) formed on the engineered substrate. Any mismatch in the crystal lattices of the adjacent layers of III-nitride materials may induce strain in the crystal lattice of one or more of the III-nitride device layers, which may effectively limit the thickness of the III-nitride device layer and/or the concentration of indium in the indium gallium nitride device layer. The presence of such lattice strain in a layer of semiconductor material may be undesirable for a number of reasons. For example, the presence of lattice strain in a layer of semiconductor material may result in an increased density of defects (e.g., lattice dislocations) in the layer of semiconductor material, undesirable morphology at the surface of the layer of semiconductor material, and may even result in the formation of cracks in the layer of semiconductor material. Furthermore, the presence of lattice strain in a layer of semiconductor material may facilitate the onset of undesirable separation of material phases within the layer of semiconductor material.

It is difficult to form an indium gallium nitride seed layer on the surface of an engineered substrate in such a manner that the indium gallium nitride seed layer has a lattice parameter that will match that of an indium gallium nitride device layer to be formed thereover. As a result, the crystal lattice of the overlying device layer of indium gallium nitride will be strained upon formation thereof using the underlying seed layer of indium gallium nitride.

In view of the above, there is a need for methods that can be used to reduce lattice parameter mismatch between adjacent layers, and the resulting lattice strain therein, in semiconductor structures and devices such as, for example, engineered substrates, integrated circuit (IC) devices, radiation-emitting devices, and radiation sensor devices.

U.S. Pat. No. 7,271,416, which issued Sep. 18, 2007 to Saxler, discloses semiconductor structures and methods of fabricating semiconductor structures for reducing strain in adjacent material layers. As disclosed therein, a semiconductor structure may include a substrate having a first in-plane unstrained lattice constant, a first layer of semiconductor material on the substrate having a second in-plane unstrained lattice constant that is different from the first in-plane unstrained lattice constant, and a variable mismatch layer comprising a second semiconductor material disposed between the substrate and the first layer of semiconductor material. The variable mismatch layer is configured to reduce stress in the first layer to below a level of stress resulting from growth of the first layer directly on the substrate. The variable mismatch layer may be a layer having a strained in-plane lattice constant that substantially matches the unstrained lattice constant of the first layer.

U.S. patent application Ser. No. 11/237,164, which was filed Sep. 27, 2005 by Krames et al. (U.S. Patent Application Publication No. 2007/0072324 A1, published Mar. 29, 2007), now U.S. Pat. No. 8,334,155, issued Dec. 18, 2012, discloses an engineered substrate for growing a light-emitting device that includes a host substrate and a seed layer bonded to the host substrate. A semiconductor structure including a light-emitting layer disposed between an n-type region and a p-type region is grown on the seed layer. A bonding layer may be used to bond the host substrate to the seed layer. The seed layer may be thinner than a critical thickness for relaxation of strain in the semiconductor structure, such that strain in the semiconductor structure is relieved by dislocations formed in the seed layer, or by gliding between the seed layer and the bonding layer. The host substrate may be separated from the semiconductor structure and seed layer by etching away the bonding layer.

The layers of semiconductor materials formed on engineered substrates are conventionally formed at elevated temperatures. As an engineered substrate is cooled from such elevated temperatures to room temperature, any mismatch in the coefficient of thermal expansion between adjacent layers of material in the substrate can result in lattice strain in one or both of the adjacent layers of material upon cooling of the substrate. Therefore, it would be desirable to preserve as well as possible the lattice constants of the crystal lattices of layers of material formed at a given temperature (e.g., an elevated temperature) as the temperature of the layers of material is subsequently changed (e.g., reduced to room temperature).

DISCLOSURE OF THE INVENTION

In some embodiments, the present invention includes methods of fabricating semiconductor structures or devices. The methods may include changing a temperature of a layer of semiconductor material from a first temperature to a second temperature, and causing a lattice parameter of the layer of semiconductor material to change from a first value to a second value as the temperature of the layer of semiconductor material is changed from the first temperature to the second temperature. The layer of semiconductor material may be bonded to another layer of material while the layer of semiconductor material is at the second temperature. After bonding the layer of semiconductor material to another layer of material, the temperature of the layer of semiconductor material may be returned to the first temperature, and the lattice parameter of the layer of semiconductor material may be prevented from returning to the first value thereof upon returning the temperature of the layer of semiconductor material to the first temperature.

The present invention includes additional embodiments of methods of fabricating semiconductor structures or devices. For example, a layer of III-V type semiconductor material may be formed on a first substrate. The first substrate may be selected to comprise a material exhibiting a first coefficient of thermal expansion. The layer of III-V type semiconductor material and the first substrate may be provided at a first temperature that is selected to impart an average lattice parameter to the layer of III-V type semiconductor material, which, optionally, may be a predetermined average lattice parameter. While the layer of III-V type semiconductor is at the first temperature, a second substrate may be attached to the layer of III-V type semiconductor material on a side thereof opposite the first substrate. The second substrate may be selected to comprise a material exhibiting a second coefficient of thermal expansion that is lower than the first coefficient of thermal expansion. The layer of III-V type semiconductor material may be removed from the first substrate after attaching the second substrate to the layer of III-V type semiconductor material, and the layer of III-V type semiconductor material and the second substrate may be cooled from the first temperature to a second temperature.

In yet further embodiments, the present invention includes methods of forming engineered substrates. For example, a layer of indium gallium nitride may be grown or otherwise formed on a first substrate that includes a base material that has a first coefficient of thermal expansion. A second substrate may be attached to the layer of indium gallium nitride on a side thereof opposite the first substrate, and the second substrate may be attached to the layer of indium gallium nitride at a temperature above about one hundred degrees Celsius (100° C.). The second substrate may be selected to include another base material that exhibits a second coefficient of thermal expansion that is less than the first coefficient of thermal expansion. For example, the second coefficient of thermal expansion may be less than about eighty percent (80%) of the first coefficient of thermal expansion. The first substrate may be removed from the layer of indium gallium nitride at a temperature above about one hundred degrees Celsius (100° C.), and the layer of indium gallium nitride may be cooled after removing the first substrate from the layer of indium gallium nitride.

Additional embodiments of the present invention include intermediate structures formed during methods of fabricating semiconductor structures or devices as described herein. For example, embodiments of the present invention include structures comprising an epitaxial layer of III-V type semiconductor material grown on and attached to a base substrate comprising a base material exhibiting a first coefficient of thermal expansion, and a bonding substrate attached to a side of the epitaxial layer of III-V type semiconductor material opposite the base substrate. The bonding substrate may comprise a base material that exhibits a second coefficient of thermal expansion that is less than the first coefficient of thermal expansion.

Embodiments of the present invention also include engineered substrates comprising a layer of semiconductor material having an average lattice parameter at room temperature that is at least proximate to an average lattice parameter of the layer of semiconductor material previously attained at an elevated temperature.

BRIEF DESCRIPTION OF THE DRAWINGS

While the specification concludes with claims particularly pointing out and distinctly claiming that which is regarded as the present invention, the advantages of this invention may be more readily ascertained from the description of the invention when read in conjunction with the accompanying drawings, in which:

DETAILED DESCRIPTION

The illustrations presented herein are not meant to be actual views of any particular material, apparatus, system, or method, but are merely idealized representations that are employed to describe the present invention. Additionally, elements common between figures may retain the same numerical designation.

As used herein, the term "III-V type semiconductor material" means and includes any material predominantly comprised of one or more elements from group IIIB of the periodic table (B, Al, Ga, In, and Ti) and one or more elements from group VB of the periodic table (N, P, As, Sb, and Bi).

As used herein, the term "II-VI type semiconductor material" means and includes any material predominantly comprised of one or more elements from group JIB of the periodic table (Zn, Cd, and Hg) and one or more elements from group VIB of the periodic table (O, S, Se, Te, and Po).

As used herein, the term "coefficient of thermal expansion," when used with respect to a material or structure, means the average linear coefficient of thermal expansion of the material or structure at room temperature.

As used herein, the term "engineered substrate," in its broadest sense, means and includes any substrate comprising two or more layers of material and that is intended to be used as a substrate for the fabrication of one or more semiconductor devices thereon. Engineered substrates include, for example, semiconductor-on-insulator type substrates.

As used herein, the term "epitaxial layer of material," means a layer of material that is at least substantially a single crystal of the material and that has been formed such that the single crystal exhibits a known crystallographic orientation.

As used herein, the term "growth lattice parameter," when used with respect to an epitaxial layer of semiconductor material, means an average lattice parameter exhibited by the layer of semiconductor material as the layer of semiconductor material is epitaxially grown at an elevated temperature.

As used herein, the term "lattice strain," when used with respect to a layer of material, means strain of the crystal lattice in directions at least substantially parallel to the plane of the layer of material. Similarly, the term "average lattice parameter," when used with respect to a layer of material, means the average lattice parameters in dimensions at least substantially parallel to the plane of the layer of material.

Embodiments of the present invention include methods and structures that facilitate the fabrication of layers of semiconductor material (such as, for example, epitaxial layers of III-V type semiconductor materials on engineered substrates) that have controlled and/or selected degrees of lattice strain and controlled and/or selected average lattice parameters. Example embodiments of methods of fabricating semiconductor structures or devices that include such layers of semiconductor material are described below with reference to FIGS. 1 through 7.

Figure 1:
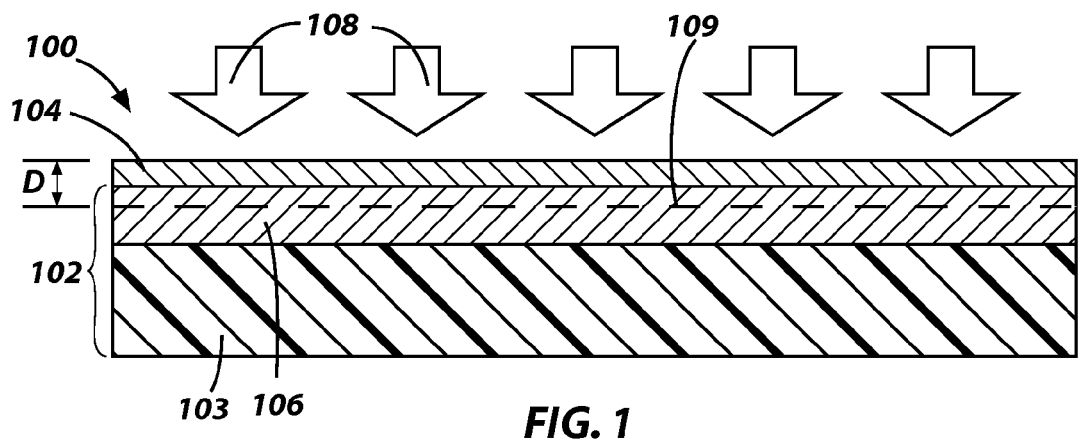
FIG. 1 is a simplified cross-sectional view of an intermediate structure that may be formed during embodiments of methods of the present invention and that includes a layer of semiconductor material attached to a base substrate.

Referring to FIG. 1, a first intermediate structure 100 may be fabricated that includes a layer of semiconductor material 104 attached to a base substrate 102. The layer of semiconductor material 104 comprises the layer in which it is desired to control and/or select the degree of lattice strain and average lattice parameter, and that may ultimately be used as, for example, a seed layer for forming one or more additional layers of semiconductor material thereon as part of the fabrication of an active semiconductor device.

In some embodiments, the layer of semiconductor material 104 may comprise an epitaxial layer of semiconductor material. Furthermore, in some embodiments, the layer of semiconductor material 104 may comprise an epitaxial layer of III-V type semiconductor material. As one particular non-limiting example, the layer of semiconductor material 104 may comprise an epitaxial layer of indium gallium nitride ($In_xGa_{1-x}N$). In some embodiments, the epitaxial layer of indium gallium nitride may have an indium concentration of less than about twelve and one-half atomic percent (12.5 at %). In further embodiments, the epitaxial layer of indium gallium nitride may have an indium concentration of less than about seven and one-half atomic percent (7.5 at %).

As shown in FIG. 1, the base substrate 102 includes a base material 103 and, optionally, one or more intermediate layers of semiconductor material 106 that are ultimately disposed between the layer of semiconductor material 104 and the base material 103. Such intermediate layers of semiconductor material 106 may be used, for example, as a seed layer for forming the layer of semiconductor material 104 thereon when it is difficult or impossible to form the layer of semiconductor material 104 directly on the base material 103 of the base substrate 102. The figures are not shown to scale, and, in actuality, the intermediate layer of semiconductor material 106 and the layer of semiconductor material 104 may be relatively thin in relation to a thickness of the base material 103 of the base substrate 102.

By way of example and not limitation, the intermediate structure 100 may comprise a single intermediate layer of semiconductor material 106 formed on the base material 103 of the base substrate 102, and the layer of semiconductor material 104 may be formed on the single intermediate layer of semiconductor material 106. As one particular non-limiting example, the intermediate layer of semiconductor material 106 may comprise an epitaxial layer of gallium nitride (GaN), and the layer of semiconductor material 104 may comprise an epitaxial layer of indium gallium nitride ($In_xGa_{1-x}N$).

To form the intermediate structure 100 shown in FIG. 1, one or more intermediate layers of semiconductor material 106 may be epitaxially grown or otherwise formed on a major surface of the base material 103, after which the layer of semiconductor material 104 may be epitaxially grown or otherwise formed on the one or more intermediate layers of semiconductor material 106. In other embodiments, the layer of semiconductor material 104 may be epitaxially grown or otherwise formed directly on the base material 103 without including any intermediate layers of semiconductor material 106.

In forming the intermediate layer of semiconductor material 106 (which may comprise, for example, a layer of gallium nitride), various methods known in the art may be used to reduce the density of dislocations therein. Such methods include, for example, epitaxial lateral overgrowth (ELO), Pendeo epitaxy, in-situ masking, etc.

The degree of strain in the crystal structure of the layer of semiconductor material 104 and, hence, the average lattice parameter of the layer of semiconductor material 104, may be controlled and/or selected by selecting the base substrate 102 to comprise a base material 103 having a first known coefficient of thermal expansion that differs from a second known coefficient of thermal expansion of the layer of semiconductor material 104, and heating the intermediate structure 100 shown in FIG. 1 to a preselected temperature that will cause the layer of semiconductor material 104 to exhibit the selected lattice strain and average lattice parameter.

For example, if the base substrate 102 comprises a base material 103 that exhibits a coefficient of thermal expansion that is lower than the coefficient of thermal expansion exhibited by the layer of semiconductor material 104, the crystal lattice of the layer of semiconductor material 104 may be in a state of compressive lattice strain upon heating the intermediate structure 100 to an elevated temperature, as atomic bonds between the base substrate 102 and the layer of semiconductor material 104 may prevent the crystal lattice of the layer of semiconductor material 104 from expanding to equilibrium dimensions for the given elevated temperature. By equilibrium dimensions, it is meant the dimensions that would be exhibited by the layer of semiconductor material 104 at a given temperature and pressure if it were not attached to the base substrate 102. If the base material 103 exhibits a coefficient of thermal expansion that is higher than the coefficient of thermal expansion exhibited by the layer of semiconductor material 104, the crystal lattice of the layer of semiconductor material 104 may be in a state of tensile lattice strain upon heating the intermediate structure 100 to an elevated temperature, as atomic bonds between the base substrate 102 and the layer of semiconductor material 104 may "stretch" the crystal lattice of the layer of semiconductor material 104 beyond equilibrium dimensions for the given elevated temperature.

In other words, the layer of semiconductor material 104 and the base material 103 may be selected to comprise materials having known, but different coefficients of thermal expansion. The temperature of the layer of semiconductor material 104 (and the entire intermediate structure 100 including the base substrate 102) then may be changed from a first temperature (e.g., room temperature) to a selected second elevated temperature. As the temperature of the layer of semiconductor material 104 is changed from the first temperature to the second temperature, the average lattice parameter of the layer of semiconductor material 104 may be caused to change from an initial first value to a selected, different second value.

In some embodiments of the present invention, the layer of semiconductor material 104 (and the entire intermediate structure 100 including the base substrate 102) may be heated to a temperature greater than about five hundred degrees Celsius (500° C.) to impart a selected lattice parameter to the layer of semiconductor material 104. Furthermore, as the layer of semiconductor material 104 is heated to impart a selected lattice parameter to the layer of semiconductor material 104, the lattice parameter may be increased by greater than about one-half of one percent (0.5%), by greater than one percent (1.0%), or even greater than one and one-half percent (1.5%).

In other embodiments, the layer of semiconductor material 104 may be grown at an elevated temperature (e.g., a temperature greater than about five hundred degrees Celsius (500° C.)) selected such that the layer of semiconductor material 104 exhibits a predetermined average lattice parameter as it is grown or otherwise formed at the elevated temperature. In other words, the layer of semiconductor material 104 may be formed under conditions selected to impart a selected and predetermined lattice parameter to the layer of semiconductor material 104.

Figure 2:
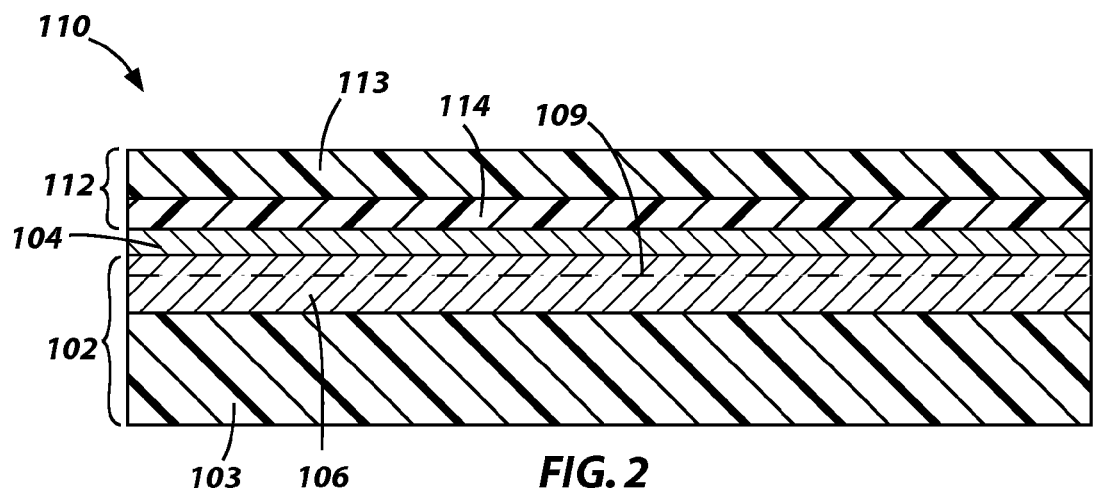
FIG. 2 is a simplified cross-sectional view of another intermediate structure that may be formed during embodiments of methods of the present invention and that includes a layer of semiconductor material attached to both a base substrate and a bonding substrate.

Referring to FIG. 2, while the layer of semiconductor material 104 is at the preselected temperature and while the crystal structure of the layer of semiconductor material 104 has a selected average lattice parameter, another bonding substrate 112 having a relatively low coefficient of thermal expansion may be bonded or attached to the layer of semiconductor material 104 on a side thereof opposite the base substrate 102. As shown in FIG. 2, the bonding substrate 112 may comprise a base material 113 and, optionally, a layer of dielectric material 114 that is ultimately disposed between the base material 113 and the layer of semiconductor material 104. The optional layer of dielectric material 114 may be used to facilitate bonding of the bonding substrate 112 to the layer of semiconductor material 104. The bonding substrate 112 and the layer of semiconductor material 104 may be bonded together by abutting them against one another, and maintaining them at an elevated temperature (selected to impart a selected lattice parameter to the layer of semiconductor material 104) (e.g., at least above one hundred degrees Celsius (100° C.)) and pressure for a sufficient amount of time.

By way of example and not limitation, in embodiments in which the layer of semiconductor material 104 comprises an epitaxial layer of indium gallium nitride ($In_xGa_{1-x}N$) and the intermediate layer of semiconductor material 106 comprises gallium nitride (GaN), the bonding substrate 112 may be bonded to the layer of indium gallium nitride at a temperature of, for example, about eight hundred degrees Celsius (800° C.) to cause the pseudomorphically strained layer of indium gallium nitride to be stretched such that its average lattice parameter is at least substantially equal to its unstrained average lattice parameter.

The bonding substrate 112 may be used to prevent the average lattice parameter of the layer of semiconductor material 104 from significantly changing as the layer of semiconductor material 104 is cooled to a reduced temperature (e.g., room temperature) after removing the base substrate 102 from an intermediate structure 110, as discussed in further detail below. In additional embodiments, upon cooling the layer of semiconductor material 104 to a reduced temperature (e.g., room temperature), the bonding substrate 112 may be used to allow or cause the average lattice parameter of the layer of semiconductor material 104 to change to a value between a first value of the average lattice parameter obtained at a reduced temperature (e.g., room temperature) prior to heating and bonding the layer of semiconductor material 104 to the bonding substrate 112 and a second value of the average lattice parameter obtained at or near the bonding temperature.

The bonding substrate 112 may be selected to comprise a material exhibiting a relatively lower coefficient of thermal expansion relative to the base substrate 102. In some embodiments, the bonding substrate 112 may be selected to comprise a material that exhibits a coefficient of thermal expansion that is less than about eighty percent (80%) of a coefficient of thermal expansion exhibited by the base substrate 102. In further embodiments, the bonding substrate 112 may be selected to comprise a material that exhibits a coefficient of thermal expansion that is less than about forty percent (40%) of a coefficient of thermal expansion exhibited by the base substrate 102.

By way of example and not limitation, the base substrate 102 may be selected to comprise a material that exhibits a coefficient of thermal expansion greater than about $5.50 \times 10^{-6°}$ C.$^{-1}$, and the bonding substrate 112 may be selected to comprise a material that exhibits a coefficient of thermal expansion that is less than about $2.5 \times 10^{6°}$ C.$^{-1}$.

As particular non-limiting examples, the base substrate 102 may be at least substantially comprised of aluminum oxide ($Al_2O_3$), zinc oxide (ZnO), yttrium aluminum oxide ($Y_3Al_5O_{12}$), or magnesium oxide (MgO). In further embodiments, the base substrate 102 may comprise a metallic substrate capable of withstanding the conditions under which the layer of semiconductor material 104 (and any optional intermediate layers of semiconductor material 106) is grown or otherwise provided thereon. For example, the base substrate 102 may be at least substantially comprised of a metal alloy like that sold under the trade name HAYNES® Alloy 214 or HAYNES® Alloy 230. In embodiments in which the base substrate 102 comprises a metal or a metal alloy, the base substrate 102 may have a coefficient of thermal expansion as high as about $20.00 \times 10^{-6°}$ C.$^{-1}$.

By way of example and not limitation, the bonding substrate 112 may be at least substantially comprised of quartz ($SiO_2$), fused silica ($SiO_2$) glass, a glass-ceramic composite material (such as, for example, that sold by Schott North America, Inc. of Duryea, Pa. under the trademark ZERODUR®), or a fused silica glass composite material (such as, for example, $SiO_2$—$TiO_2$ or $Cu_2$—$Al_2O_3$—$SiO_2$). Such bonding substrates 112 may exhibit a coefficient of thermal expansion that is less than about $5.5 \times 10^{-6°}$ C.$^{-1}$, less than about $2.5 \times 10^{-6°}$ C.$^{-1}$, less than about $0.5 \times 10^{-6°}$ C.$^{-1}$, or even less than about $0.2 \times 10^{-6°}$ C.$^{-1}$.

In some embodiments, the layer of semiconductor material 104 may exhibit a coefficient of thermal expansion between those of the base substrate 102 and the bonding substrate 112. For example, the base substrate 102 may be selected to comprise a material exhibiting a coefficient of thermal expansion greater than about one hundred ten percent (110%) of the coefficient of thermal expansion exhibited by the layer of semiconductor material 104, and the bonding substrate 112 may be selected to comprise a material exhibiting a coefficient of thermal expansion less than about ninety percent (90%) of the coefficient of thermal expansion exhibited by the layer of semiconductor material 104. By way of example and not limitation, the layer of semiconductor material 104 may exhibit a coefficient of thermal expansion that is less than about $5.00 \times 10^{6°}$ C.$^{-1}$ and greater than about $2.80 \times 10^{-6°}$ C.$^{-1}$.

In other embodiments of the invention, however, the layer of semiconductor material 104 may exhibit a coefficient of thermal expansion that is greater than that of the base substrate 102 or below that of the bonding substrate 112.

Figure 3:
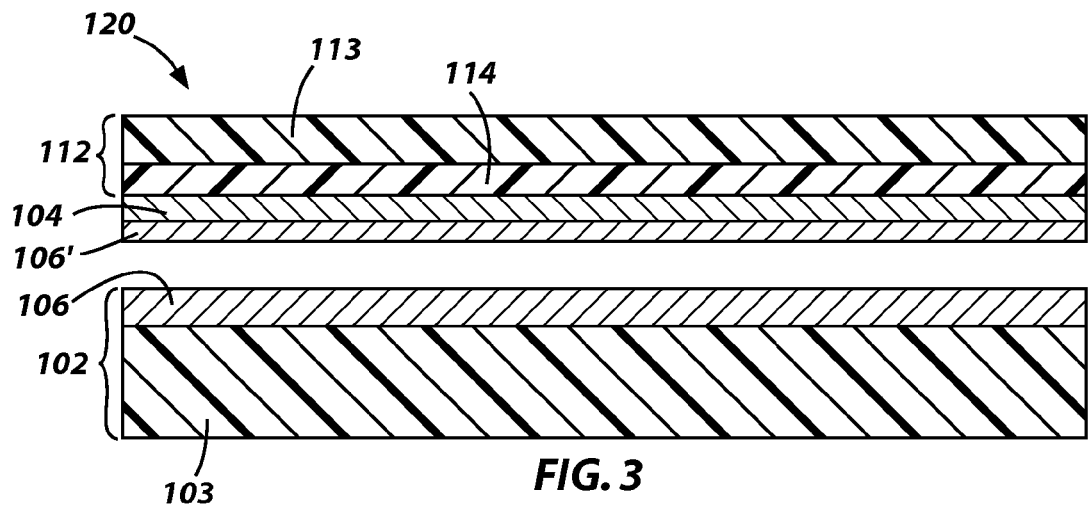
FIG. 3 is a simplified cross-sectional view illustrating delamination of the intermediate structure of FIG. 2.

Referring to FIG. 3, after bonding the bonding substrate 112 to the layer of semiconductor material 104, the layer of semiconductor material 104, together with the bonding substrate 112, may be removed from the base substrate 102 (or the base substrate 102 may be removed from the layer of semiconductor material 104) to form a third intermediate structure 120. By way of example and not limitation, the process known in the industry as the SMART CUT® process may be used to separate the base substrate 102 from the layer of semiconductor material 104. Such processes are described in detail in, for example, U.S. Pat. No. RE39,484 to Bruel, U.S. Pat. No. 6,303,468 to Aspar et al., U.S. Pat. No. 6,335,258 to Aspar et al., U.S. Pat. No. 6,756,286 to Moriceau et al., U.S. Pat. No. 6,809,044 to Aspar et al., and U.S. Pat. No. 6,946,365 to Aspar et al.

Briefly, referring again to FIG. 1, a plurality of ions (e.g., hydrogen, helium, or inert gas ions) may be implanted into the intermediate structure 100. For example, ions may be implanted into the intermediate structure 100 from an ion source (not shown) positioned on a side of the intermediate structure 100 adjacent the layer of semiconductor material 104. As represented by the directional arrows 108 shown in FIG. 1, ions may be implanted into the intermediate structure 100 along a direction substantially perpendicular to the layer of semiconductor material 104. As known in the art, the depth at which the ions are implanted into the intermediate structure 100 is at least partially a function of the energy with which the ions are implanted into the intermediate structure 100. Generally, ions implanted with less energy will be implanted at relatively shallower depths, while ions implanted with higher energy will be implanted at relatively deeper depths.

Ions may be implanted into the intermediate structure 100 with a predetermined energy selected to implant the ions at a desired depth D within the intermediate structure 100. As known in the art, inevitably at least some ions may be implanted at depths other than the desired implantation depth, and a graph of the concentration of the ions as a function of depth into the intermediate structure 100 from the exposed surface of the layer of semiconductor material 104 may exhibit a generally bell-shaped (symmetric or asymmetric) curve having a maximum at the desired implantation depth.

Upon implantation into the intermediate structure 100, the ions may define an ion implant layer 109 within the intermediate structure 100. The ion implant layer 109 may comprise a layer or region within the intermediate structure 100 that is aligned with (e.g., centered about) the plane of maximum ion concentration with the intermediate structure 100. The ion implant layer 109 may define a zone of weakness within the intermediate structure 100 along which the intermediate structure 100 may be cleaved or fractured in a subsequent process, as described in further detail below.

In some embodiments of the present invention, the ion implant layer 109 may be disposed in one or both of the layer of semiconductor material 104 and an intermediate layer of semiconductor material 106. In other words, the ion implant layer 109 may be disposed entirely within the layer of semiconductor material 104, entirely within an intermediate layer of semiconductor material 106, or partially within the layer of semiconductor material 104 and partially within an intermediate layer of semiconductor material 106. As one particular non-limiting example, in some embodiments, the ion implant layer 109 may be disposed within an intermediate layer of semiconductor material 106 adjacent the layer of semiconductor material 104 at a depth between about one hundred nanometers (100 nm) and about three hundred nanometers (300 nm) below the layer of semiconductor material 104.

After attaching the bonding substrate 112 to the layer of semiconductor material 104 on a side thereof opposite the base substrate 102 to form the intermediate structure 110, as previously described with reference to FIG. 2, the intermediate structure 110 may be subjected to a thermal treatment process to cause the intermediate structure 110 to cleave or fracture along the ion implant layer 109, thereby forming the intermediate structure 120 shown in FIG. 3. In other words, the layer of semiconductor material 104 and, optionally, a portion 106' of the underlying intermediate layer of semiconductor material 106 may be delaminated from the remaining portion of the intermediate layer of semiconductor material 106 and the underlying base substrate 102 upon thermally treating the intermediate structure 110.

By way of example and not limitation, after attaching the bonding substrate 112 to the layer of semiconductor material 104 to form the intermediate structure 110, and prior to cooling the intermediate structure 110, the temperature of the intermediate structure 110 may be maintained at an elevated temperature (i.e., above about 100° C.) for an amount of time sufficient to cause the implanted ions within the ion implant layer 109 to coalesce and form a plurality of microcavities and/or inclusions. The elevated temperature at which this thermal treatment process is carried out may be at, below, or above a temperature at which the bonding substrate 112 is attached to the layer of semiconductor material 104. Furthermore, the dose of the ion implantation process used to form the ion implant layer 109 (and, hence, the concentration of ions in the ion implant layer 109) may be tailored such that the thermal budget (i.e., the heat input) required to cause the intermediate structure 110 to fracture along the ion implant layer 109 is greater than the thermal budget required to bond the bonding substrate 112 to the layer of semiconductor material 104 to ensure that the intermediate structure 110 does not fracture along the ion implant layer 109 before the bonding substrate 112 is attached to the layer of semiconductor material 104.

In some embodiments of the present invention, after thermally treating the intermediate structure 110 (FIG. 2) to structurally weaken the ion implant layer 109, splitting of the intermediate structure 110 along the ion implant layer 109 may be initiated by changing a temperature of the intermediate structure 110. As the temperature of the intermediate structure 110 is changed, differences in the coefficient of thermal expansion between the base substrate 102 and the bonding substrate 112 may result in the generation of stresses within the intermediate structure 110 that will ultimately lead to fracture of the intermediate structure 110 along the thermally treated ion implant layer 109. As a non-limiting example, splitting of the intermediate structure 110 along the ion implant layer 109 may be initiated as the intermediate structure 110 is cooled (e.g., to room temperature) after thermally treating the intermediate structure 110 to structurally weaken the ion implant layer 109.

Figure 4:
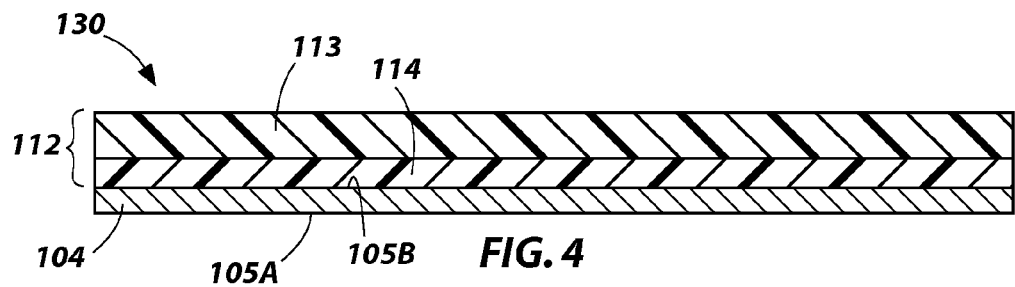
FIG. 4 is a simplified cross-sectional view of another intermediate structure that may be formed during embodiments of methods of the present invention and that includes a layer of semiconductor material attached to a bonding substrate after removal of a base substrate from the layer of semiconductor material, as shown in FIG. 3.

Referring to FIG. 3, any remaining portion 106' of the intermediate layer of semiconductor material 106 that is left on the intermediate structure 120 may be removed to expose a major surface of the layer of semiconductor material 104 on a side thereof opposite the bonding substrate 112 to provide a further intermediate structure 130 shown in FIG. 4. By way of example and not limitation, the intermediate structure 120 may be subjected to an etching process to remove any remaining portion 106' of the intermediate layer of semiconductor material 106 and form the intermediate structure 130 of FIG. 4.

Optionally, an etch stop layer (not shown) may be provided between the intermediate layer of semiconductor material 106 and the layer of semiconductor material 104 during fabrication of the intermediate structure 100 shown in FIG. 1 to facilitate the later removal of any remaining portion 106' of the intermediate layer of semiconductor material 106 on the intermediate structure 120. In other words, another layer of material that will not be removed by an etchant when the etchant is used to remove the remaining portion 106' of the intermediate layer of semiconductor material 106, and that can be subsequently removed from the intermediate structure 120 (FIG. 3) without causing any substantial damage to the layer of semiconductor material 104, may be provided between the intermediate layer of semiconductor material 106 and the layer of semiconductor material 104 during fabrication of the intermediate structure 100 shown in FIG. 1.

As one particular non-limiting example, in embodiments in which the layer of semiconductor material 104 comprises a layer of indium gallium nitride ($In_xGa_{1-x}N$), and the intermediate layer of semiconductor material 106 comprises a layer of gallium nitride (GaN), an etch stop layer comprising aluminum gallium nitride ($Al_xGa_{1-x}N$) (e.g., $Al_{0.1}Ga_{0.9}N$) may be provided between the layer of semiconductor material 104 and the intermediate layer of semiconductor material 106. In such embodiments, an inductively coupled plasma (ICP) etching process, for example, may be used to etch away any remaining portion 106' of the intermediate layer of semiconductor material 106 on the intermediate structure 120 using a gaseous plasma generated from a gaseous mixture comprising chlorine gas ($Cl_2$), argon gas (Ar), and, optionally, oxygen gas ($O_2$). By way of example and not limitation, a flow rate of about thirty standard cubic centimeters per minute (30 sccm) of chlorine gas ($Cl_2$), a flow rate of about ten standard cubic centimeters per minute (10 sccm) of argon gas (Ar), and a flow rate between zero and about eight standard cubic centimeters per minute (0-8 sccm) of oxygen gas ($O_2$) may be used in providing the plasma within the plasma chamber. The chamber pressure may be maintained at about ten millitorr (10 mTorr), and the table temperature may be maintained at about twenty degrees Celsius (20° C.). Under these conditions, an inductively coupled plasma (ICP) power of about one thousand watts (1,000 W) and a radio frequency (RF) power of between about one hundred watts (100 W) and about two hundred fifty watts (250 W) may be used to generate the plasma. After etching away the remaining portion 106' of the intermediate layer of semiconductor material 106, the aluminum gallium nitride ($Al_xGa_{1-x}N$) etch stop layer (not shown) may be removed, for example, using a wet chemical etching process. By way of example and not limitation, the aluminum gallium nitride ($Al_xGa_{1-x}N$) etch stop layer may be etched away using a solution comprising potassium hydroxide (KOH) at a temperature of about eighty-five degrees Celsius (85° C.).

The present invention is not limited to use of a SMART CUT® process for separating the base substrate 102 and the layer of semiconductor material 104 (together with the bonding substrate 112), and embodiments of methods of the present invention may include any other methods for separating the base substrate 102 and the layer of semiconductor material 104 or for simply removing the base substrate 102 from the layer of semiconductor material 104. For example, etching processes, grinding processes, and laser lift-off processes may be used for removing the base substrate 102 from the layer of semiconductor material 104 in accordance with embodiments of the present invention.

The intermediate structure 130 shown in FIG. 4 optionally may be used as an engineered substrate, and an active device may be fabricated on the intermediate structure 130 by, for example, using the layer of semiconductor material 104 as a seed layer. In other words, an epitaxial layer of a device structure may be formed on an exposed major surface 105A of the layer of semiconductor material 104, as shown in FIG. 4. In other embodiments, however, it may be desirable to use an opposite major surface 105B of the layer of semiconductor material 104 (which is not exposed), as the opposing major surfaces 105A, 105B of the layer of semiconductor material 104 may exhibit different polarities. Therefore, the layer of semiconductor material 104 may be transferred to another substrate to expose the major surface 105B, as discussed in further detail below.

Figure 5:
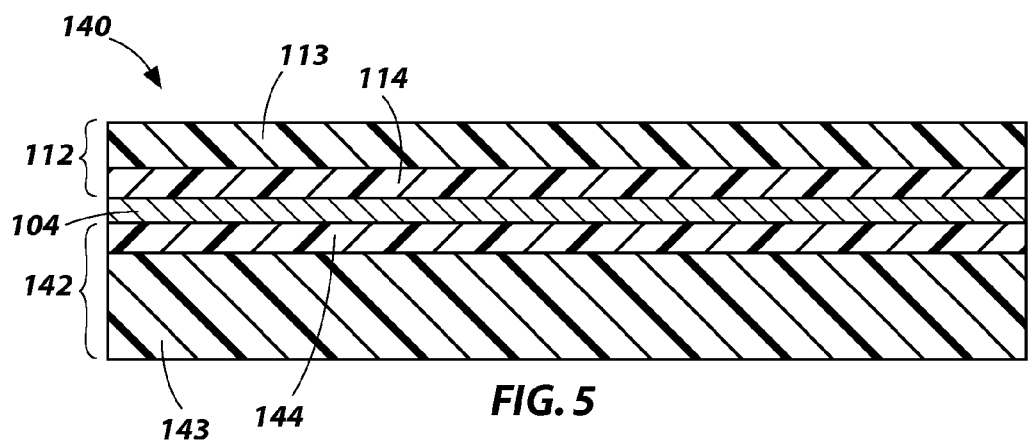
FIG. 5 is a simplified cross-sectional view of another intermediate structure that may be formed during embodiments of methods of the present invention and that includes a layer of semiconductor material attached to both a bonding substrate and a receiving substrate.

The intermediate structure 130 of FIG. 4 may be bonded to a receiving substrate 142 to form another intermediate structure 140 shown in FIG. 5. More particularly, the layer of semiconductor material 104 in the intermediate structure 130 may be bonded to the receiving substrate 142 such that the receiving substrate 142 is attached to the layer of semiconductor material 104 on a side thereof opposite the bonding substrate 112. As shown in FIG. 5, the receiving substrate 142 may comprise a base material 143 and an optional layer of dielectric material 144 disposed on the base material 143. The optional layer of dielectric material 144 may be used to facilitate bonding between the base material 143 of the receiving substrate 142 and the layer of semiconductor material 104. The receiving substrate 142 and the layer of semiconductor material 104 may be bonded together by abutting them against one another, and maintaining them at an elevated temperature (e.g., at least above one hundred degrees Celsius (100° C.)) and pressure for a sufficient amount of time.

By way of example and not limitation, the base material 143 of the receiving substrate 142 may comprise a material that exhibits a coefficient of thermal expansion greater than a coefficient of thermal expansion exhibited by the bonding substrate 112. For example, the base material 143 of the receiving substrate 142 may comprise a material that exhibits a coefficient of thermal expansion greater than about $5.50 \times 10^{-6}$ $C.^{-1}$. As particular non-limiting examples, the base material 143 of the receiving substrate 142 may be at least substantially comprised of aluminum oxide ($Al_2O_3$), zinc oxide (ZnO), yttrium aluminum oxide ($Y_3Al_5O_{12}$), or magnesium oxide (MgO). In further embodiments, the base material 143 of the receiving substrate 142 may comprise a metallic material such as, for example, those sold under the trade name HAYNES® Alloy 214 and HAYNES® Alloy 230. In some embodiments, the receiving substrate 142 may be at least substantially transparent to certain wavelengths of electromagnetic radiation (e.g., visible light) to enable such radiation to pass through the receiving substrate 142 during operation of a device subsequently fabricated over the layer of semiconductor material 104.

Optionally, in some embodiments of the present invention, the receiving substrate 142 may be at least substantially identical to the previously described base substrate 102. In yet further embodiments, a single substrate may be used as both the base substrate 102 and a receiving substrate 142.

Figure 6:
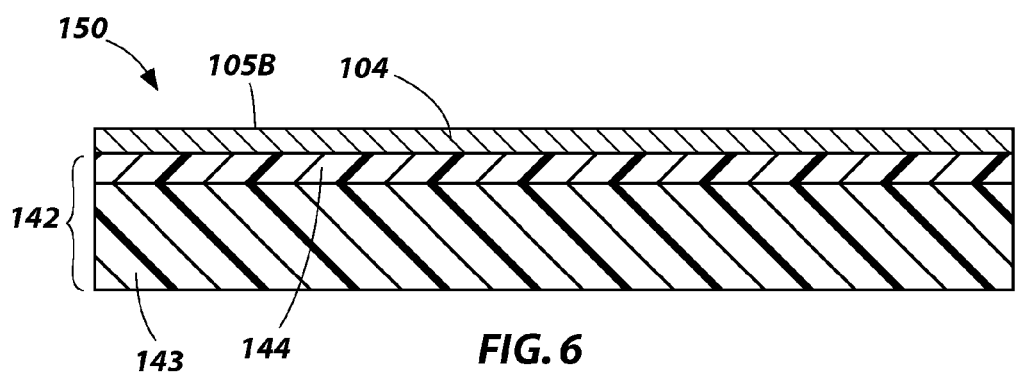
FIG. 6 is a simplified cross-sectional view of another intermediate structure that may be formed during embodiments of methods of the present invention and that includes a layer of semiconductor material attached to a receiving substrate after removal of a bonding substrate from the layer of semiconductor material.

After forming the intermediate structure 140 shown in FIG. 5, the bonding substrate 112 may be removed from the intermediate structure 140 to form the intermediate structure 150 shown in FIG. 6. By way of example and not limitation, the bonding substrate 112 may be removed using an etching process (e.g., a dry plasma etching process or a wet chemical etching process). In other embodiments, however, a laser lift-off process may be used to remove the bonding substrate 112. Laser lift-off processes are disclosed in, for example, U.S. Pat. No. 6,559,075 to Kelly et al., issued May 6, 2003, in U.S. Pat. No. 6,740,604 to Kelly et al., issued May 25, 2004, and in U.S. Pat. No. 7,341,925 to Kelly et al., issued Mar. 11, 2008. By using a laser lift-off process, the bonding substrate 112 may be preserved and reused.

As previously discussed, the bonding substrate 112 exhibits a relatively low coefficient of thermal expansion. Therefore, as the temperature of the layer of semiconductor material 104 is varied after bonding the layer of semiconductor material 104 to the bonding substrate 112, the bonding substrate 112 constrains or maintains the average lattice parameter of the crystal lattice of the layer of semiconductor material 104 near or at least substantially equal to an average lattice parameter of the semiconductor material 104 previously attained at an elevated temperature (e.g., at least above one hundred degrees Celsius (100° C.)). For example, the bonding substrate 112 constrains or maintains the average lattice parameter of the crystal lattice of the layer of semiconductor material 104 near or at least substantially equal to an average lattice parameter of the semiconductor material 104 previously attained at the temperature at which the layer of semiconductor material 104 was bonded to the bonding substrate 112. As a result, the layer of semiconductor material 104 in the intermediate structure 150 shown in FIG. 6 may have an average lattice parameter of the crystal lattice of the layer of semiconductor material 104 near or at least substantially equal to the average lattice parameter of the crystal lattice of the layer of semiconductor material 104 at the time the layer of semiconductor material 104 was bonded to the bonding substrate 112.

As previously described herein, in some embodiments of the present invention, the lattice parameter of the layer of semiconductor material 104 may be increased by greater than about one-half of one percent (0.5%), by greater than one percent (1.0%), or even greater than one and one-half percent (1.5%), as the layer of semiconductor material 104 is heated to impart a selected lattice parameter to the layer of semiconductor material 104 prior to attaching the bonding substrate 112 thereto. After attaching the bonding substrate 112 to the layer of semiconductor material 104, and removing the base substrate 102 from the layer of semiconductor material 104, in some embodiments of the present invention, the lattice parameter of the layer of semiconductor material 104 may be maintained above an initial growth lattice parameter of the layer of semiconductor material 104 by at least about one quarter of one percent (0.25%) of the initial growth lattice parameter as the temperature of the layer of semiconductor material 104 is reduced.

Figure 7:
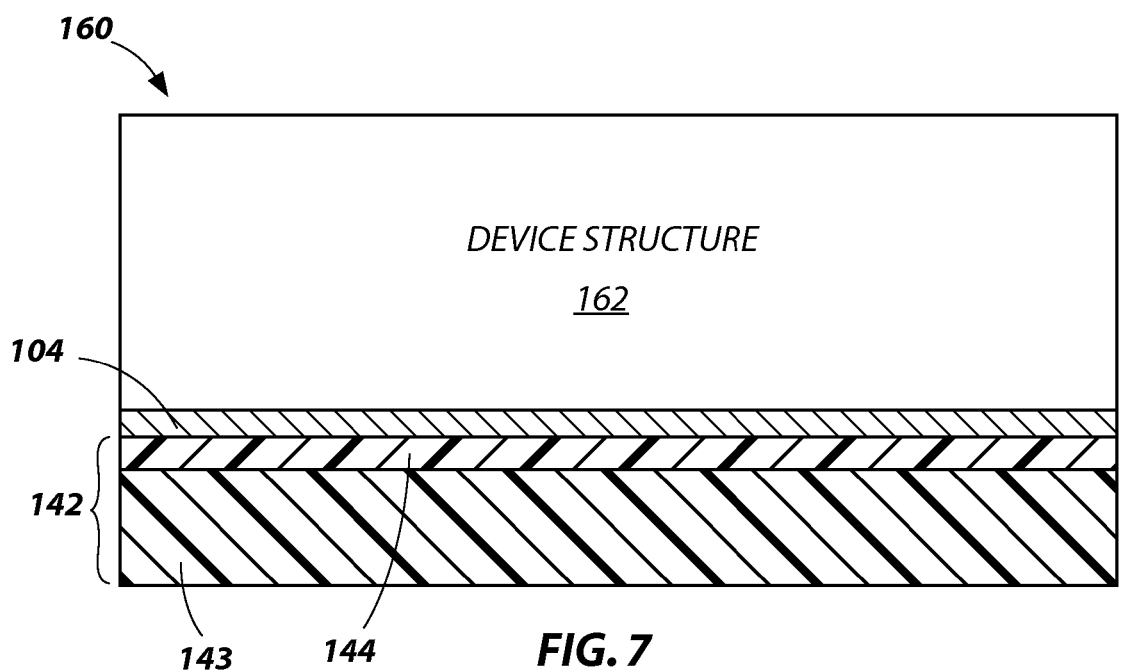
FIG. 7 is a simplified cross-sectional view of a semiconductor structure or device that includes a stack of device layers disposed on the intermediate structure shown in FIG. 6.

The intermediate structure 130 shown in FIG. 4 optionally may be used as an engineered substrate. Referring to FIG. 7, in some embodiments of the present invention, a device structure 162 may be formed on the layer of semiconductor material 104 of the intermediate structure 150 (FIG. 6) to form a semiconductor device 160. In some embodiments, the layer of semiconductor material 104 may comprise a seed layer used to initiate growth of overlying layers of semiconductor material that together form the device structure 162. The particular nature of the device structure 162 is not central to this invention, and embodiments of the present invention may be used to form any device structure 162 and semiconductor device 160. By way of non-limiting examples, the device structure 162 may comprise at least a portion of an integrated circuit (IC) device (e.g., a logic processor or a memory device), a radiation-emitting device (e.g., a light-emitting diode (LED), a resonant cavity light-emitting diode (RCLED), or a vertical cavity surface-emitting laser (VCSEL)), or a radiation sensing devices (e.g., an optical sensor).

As previously discussed, the layer of semiconductor material 104 of the intermediate structure 150 (which, comprises an embodiment of an engineered substrate within the scope of the present invention) may be fabricated in such a manner as to comprise a crystal lattice having a controlled and/or selected lattice parameter and reduced lattice strain. Furthermore, by selectively tailoring the lattice parameter of the layer of semiconductor material 104, lattice mismatch between the layer of semiconductor material 104 and overlying layers of semiconductor material forming part of a device structure 162 may be reduced or eliminated. As a result, embodiments of the present invention may allow the fabrication of layers of semiconductor material in a device structure 162 that are relatively less susceptible to the onset of undesirable separation of material phases within the layer of semiconductor material relative to known devices. For example, in accordance with some embodiments of the present invention, the layer of semiconductor material 104 may comprise a layer of indium gallium nitride ($In_xGa_{1-x}N$). Another epitaxial layer of indium gallium nitride of a device structure 162 may be formed thereon. By eliminating reducing or eliminating mismatch in the lattice parameters of the adjacent layers of indium gallium nitride, the layer of indium gallium nitride in the device structure 162 may be formed to comprise combinations of layer thickness and indium concentrations, whilst maintaining a single phase of material, previously unattainable using fabrication methods known in the art.

By way of example and not limitation, a layer of semiconductor material 104 comprising indium gallium nitride ($In_xGa_{1-x}N$) may be used, for example, to grow another epitaxial layer of indium gallium nitride ($In_xGa_{1-x}N$) thereon that exhibits a single phase material and that has an indium content larger than about five atomic percent (5 at %) and a thickness greater than about five hundred nanometers (500 nm) thereon.

For example, using embodiments of methods of the present invention described above, an engineered substrate (such as, for example, the intermediate structure 130 shown in FIG. 4 or the intermediate substrate 150 shown in FIG. 6) may be formed to include an exposed seed layer of semiconductor material 104 comprising indium gallium nitride $In_{0.07}Ga_{0.93}N$ and having an average lattice parameter of about 3.21 Angstroms. The seed layer of semiconductor material 104 may be formed (as previously described with reference to FIG. 1) to have a thickness below a critical thickness for the on-set of strain relaxation and defect formation (e.g., a thickness below about fifty nanometers (50 nm) for $In_{0.07}Ga_{0.93}N$). The seed layer of semiconductor material 104 may be used to grow another epitaxial layer of indium gallium nitride $In_{0.07}Ga_{0.93}N$ thereon having a thickness of, for example, greater than about five hundred nanometers (500 nm), as previously described with reference to FIG. 7.

As another example, an engineered substrate (such as, for example, the intermediate structure 130 shown in FIG. 4 or the intermediate substrate 150 shown in FIG. 6) may be formed to include an exposed seed layer of semiconductor material 104 comprising indium gallium nitride $In_{0.15}Ga_{0.85}N$ and having an average lattice parameter of about 3.24 Angstroms. The seed layer of semiconductor material 104 may be formed (as previously described with reference to FIG. 1) to have a thickness below a critical thickness for the on-set of strain relaxation and defect formation (e.g., a thickness below about two hundred nanometers (200 nm), or even below about twenty nanometers (20 nm) for $In_{0.15}Ga_{0.85}N$). The seed layer of semiconductor material 104 may be used to grow another epitaxial layer of indium gallium nitride $In_{0.15}Ga_{0.85}N$ thereon having a thickness of, for example, greater than about five hundred nanometers (500 nm), as previously described with reference to FIG. 7.

As yet another example, an engineered substrate (such as, for example, the intermediate structure 130 shown in FIG. 4 or the intermediate substrate 150 shown in FIG. 6) may be formed to include an exposed seed layer of semiconductor material 104 comprising indium gallium nitride $In_{0.25}Ga_{0.75}N$ and having an average lattice parameter of about 3.26 Angstroms. The seed layer of semiconductor material 104 may be formed (as previously described with reference to FIG. 1) to have a thickness below a critical thickness for the on-set of strain relaxation and defect formation (e.g., a thickness below about one hundred nanometers (100 nm), or even below about five nanometers (5 nm) for $In_{0.25}Ga_{0.75}N$). The seed layer of semiconductor material 104 may be used to grow another epitaxial layer of indium gallium nitride $In_{0.25}Ga_{0.75}N$ thereon having a thickness of, for example, greater than about five hundred nanometers (500 nm), as previously described with reference to FIG. 7.

Although embodiments of the present invention have been primarily described herein with reference to layers of semiconductor material 104 comprising indium gallium nitride, the present invention is not so limited, and embodiments of the present invention may be used to provide layers of semiconductor material comprising other III-nitride materials, layers of other III-V type semiconductor materials, or layers of other semiconductor materials (such as, for example, layer of II-VI type semiconductor materials, layers of silicon, and layers of germanium).

While the present invention has been described herein with respect to certain preferred embodiments, those of ordinary skill in the art will recognize and appreciate that it is not so limited. Rather, many additions, deletions and modifications to the preferred embodiments may be made without departing from the scope of the invention as hereinafter claimed. In addition, features from one embodiment may be combined with features of another embodiment while still being encompassed within the scope of the invention as contemplated by the inventors.

What is claimed is:

1. An engineered substrate, comprising an epitaxial layer of semiconductor material bonded to a bonding substrate, the engineered substrate formed by growing the epitaxial layer of semiconductor material on a base substrate and subsequently transferring the layer of semiconductor material from the base substrate to the bonding substrate at a bonding temperature at least above 100° C. to impart a selected lattice parameter to the layer of semiconductor material, wherein the epitaxial layer of semiconductor material has a first coefficient of thermal expansion and the bonding substrate has a second coefficient of thermal expansion different than the first coefficient of thermal expansion, the second coefficient of thermal expansion being such that an average lattice parameter of the epitaxial layer of semiconductor material is maintained within an initial growth lattice parameter of the layer of semiconductor material by about one quarter of one percent (0.25%) of the initial growth lattice parameter as a temperature of the engineered substrate is reduced from the bonding temperature to room temperature.

2. The engineered substrate of claim 1, wherein the epitaxial layer of semiconductor material has an average lattice parameter at room temperature at least substantially equal to an average lattice parameter of the epitaxial layer of semiconductor material when the engineered substrate is at a temperature of 500° C.

3. The engineered substrate of claim 1, wherein the epitaxial layer of semiconductor material comprises an epitaxial layer of indium gallium nitride.

4. The engineered substrate of claim 3, wherein the epitaxial layer of indium gallium nitride has an average thickness of less than about two hundred nanometers (200 nm).

5. The engineered substrate of claim 3, wherein the epitaxial layer of indium gallium nitride has an indium concentration of less than about twelve and one-half atomic percent (12.5 at %).

6. The engineered substrate of claim 3, wherein the bonding substrate has a coefficient of thermal expansion of less than about $2.5 \times 10^{-6}$ ° $C.^{-1}$.

7. The engineered substrate of claim 3, further comprising an additional epitaxial layer of indium gallium nitride formed on the epitaxial layer of indium gallium nitride, the additional epitaxial layer of indium gallium nitride having a thickness greater than about five hundred nanometers (500 nm) and a concentration of indium greater than about five atomic percent (5 at %).

8. The engineered substrate of claim 5, wherein the epitaxial layer of indium gallium nitride has an indium concentration of less than about seven and one-half atomic percent (7.5 at %).

9. An engineered substrate, comprising a layer of semiconductor material bonded to a bonding substrate, the engineered substrate formed by growing the epitaxial layer of semiconductor material on a base substrate and subsequently transferring the layer of semiconductor material from the base substrate to the bonding substrate at a bonding temperature at least above 100° C. and selected to impart a selected lattice parameter to the layer of semiconductor material, wherein the layer of semiconductor material has a first coefficient of thermal expansion and the bonding substrate has a second coefficient of thermal expansion different than the first coefficient of thermal expansion, the second coefficient of thermal expansion being less than about 90% of the first coefficient of thermal expansion, wherein the layer of semiconductor material has an average lattice parameter at room temperature within about one quarter of one percent (0.25%) of an average lattice parameter of the epitaxial layer of semiconductor material when the engineered substrate is at a temperature of 500° C.

10. The engineered substrate of claim 9, wherein the layer of semiconductor material has an average lattice parameter at room temperature that is substantially equal to the average lattice parameter of the layer of semiconductor material when the engineered substrate is at a temperature of 500° C.

11. The engineered substrate of claim 9, wherein the layer of semiconductor material comprises an epitaxial layer of indium gallium nitride.

12. The engineered substrate of claim 11, wherein the epitaxial layer of indium gallium nitride has an average thickness of less than about two hundred nanometers (200 nm).

13. The engineered substrate of claim 11, wherein the epitaxial layer of indium gallium nitride has an indium concentration of less than about twelve and one-half atomic percent (12.5 at %).

14. The engineered substrate of claim 11, wherein the bonding substrate has a coefficient of thermal expansion of less than about $2.5 \times 10^{-6}$ ° $C.^{-1}$.

* * * * *

UNITED STATES PATENT AND TRADEMARK OFFICE
CERTIFICATE OF CORRECTION

PATENT NO. : 9,793,360 B2
APPLICATION NO. : 14/314804
DATED : October 17, 2017
INVENTOR(S) : Chantal Arena Page 1 of 1

It is certified that error appears in the above-identified patent and that said Letters Patent is hereby corrected as shown below:

In the Specification
Column 6, Line 9, change "from group JIB" to --from group IIB--

Signed and Sealed this
Twenty-third Day of January, 2018

Joseph Matal
*Performing the Functions and Duties of the
Under Secretary of Commerce for Intellectual Property and
Director of the United States Patent and Trademark Office*